United States Patent [19]
Deb

[11] Patent Number: 6,160,257
[45] Date of Patent: Dec. 12, 2000

[54] HYBRIDIZED BIOLOGICAL MICROBOLOMETER

[75] Inventor: Krishna Deb, Beltsville, Md.

[73] Assignee: The United States of America as represented by the Secretary of the Army, Washington, D.C.

[21] Appl. No.: 09/114,249

[22] Filed: Jul. 6, 1998

[51] Int. Cl.[7] .......................... H01L 31/0256; H01L 31/09
[52] U.S. Cl. ..................................... 250/338.1; 250/370.12
[58] Field of Search ............................. 250/338.1, 370.12

[56] References Cited

U.S. PATENT DOCUMENTS

| | | | |
|---|---|---|---|
| 5,389,475 | 2/1995 | Yanagisawa et al. | 430/19 |
| 5,629,665 | 5/1997 | Kaufmann et al. | 338/18 |

FOREIGN PATENT DOCUMENTS

91/16607  10/1991  WIPO.

*Primary Examiner*—Constantine Hannaher
*Attorney, Agent, or Firm*—Paul S. Clohan, Jr.

[57] ABSTRACT

A Microbolometer constructed of Biological and Non-Biological components, using proteins with greater sensitivity to imaging, as the infrared radiation detectors.

5 Claims, 2 Drawing Sheets

HYBRIDIZED BIOLOGICAL MICROBOLOMETER

RIGHTS OF THE GOVERNMENT

The invention described herein may be manufactured, used and licensed by or for the Government without the payment to me of any royalties thereon.

FIELD OF THE INVENTION

This invention is related to the field of uncooled infrared detector technology, and particularly thin film structures consisting of Biological and Non-Biological Components which have potential for high performance detector arrays comparable to cryogenically cooled detector arrays. It is anticipated protein detectors could be useful to long range applications and can replace high cost cooled detectors in the future.

BACKGROUND INFORMATION

Applicant's invention pertains to a Thermal Infrared Detector of the thin film resistance bolometer type, wherein infrared radiation (IR) incident on the Bolometer is absorbed, resulting in a temperature rise of the Bolometer Detector and therefore a change in the resistance of the Bolometer Detectors, which can then be transmitted or recorded by currently available electrical circuits.

Thin film infrared detector are described in U.S. Pat. Nos. 4,574,263, 4,116,063 and 3,069,644 using $VO_x$ or semiconductive materials.

BRIEF SUMMARY OF THE INVENTION

This invention is a new type of uncooled Microbolometer for use as an infrared detector. An increase in sensitivity over the currently available microbolometers is achieved by increasing the temperature coefficient of resistance (TCR), of the composition of the Microbolometer, by replacing vanadium oxide with selected proteins and/or DNA material in a device structure of silicon dioxide and silicon.

This new hybridized biological composition provides higher imaging sensitivity because of its higher temperature coefficient of resistance (TCR) properties defined as TCR= 1/R (dR/dT) where R is the material resistance at the operating temperature TC. Routinely obtained TCR valves for $VO_x$ are close to −3%/°C. but proteins and DNAs are expected to give higher TCR values of the order of +8 to +12%/°C. The low sheet resistance (~1–2 ohms/square) of the proteins listed in the claims further reduces 1/f as well as Johnson noise giving higher resolution in thermal imagers.

DESCRIPTION OF THE INVENTION

The hybridized Biological Microbolometer consists of both Biological and Non-Biological components in which the agents responsible for transport of energy and sensing are electrons and/or ions.

Biological systems self-construct, they are compact, economical, fast, sensitive and their actions are very specific.

The infrared Detector is comprised essentially of a thin film of protein, selected from a list of temperature-sensitive proteins, prepared on a silicon dioxide/Silicon support structure. The thin film of protein is the infrared detector sensing element instead of $VO_x$ or semiconductive materials. Each infrared detector device structure comprises a pixel or single detector element. Each infrared detector is connected to an electronic circuit for readout purposes, and in the case of a multi-dimensional monolithic array each infrared detector would be part of a more complex electronic readout system.

DESCRIPTION OF THE PREFERRED EMBODIMENT

The substrate is a monocrystalline silicon wafer having a 1,0,0 surface orientation.

Figure 1:
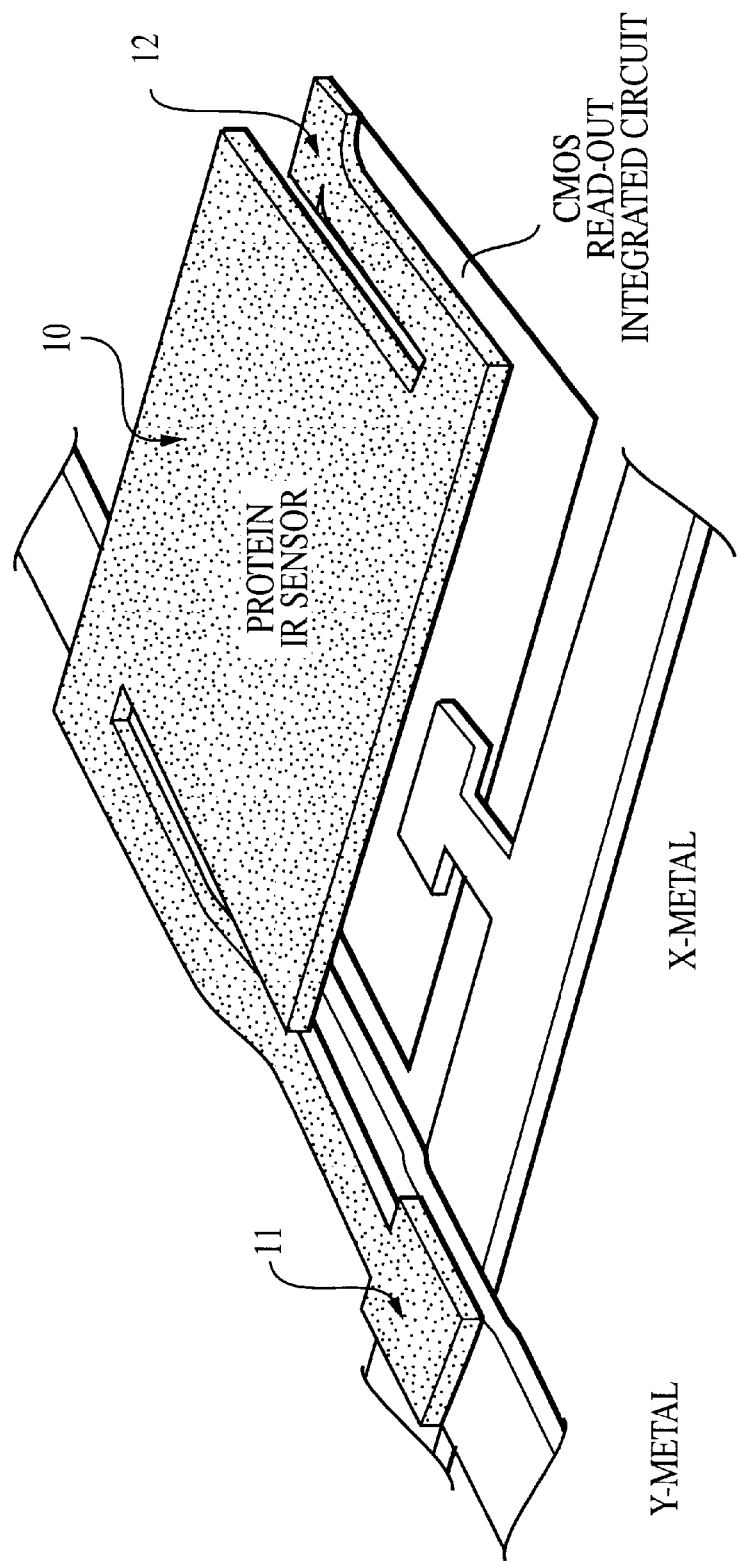
FIG. 1 is a representation of a single detector element.

Referring to FIG. 1 it is seen that the protein sensor (10) has electrodes 11 and 12. The protein detector (10) is comprised of a two-dimensional array where a part of its readout electronics is directly underneath the detector pixel. Because of the low resistance of protein (~1 ohm) the readout mechanism should be very fast when compared with inorganic bolometric arrays. Vanadium oxide or semiconductors have much higher resistance of the order of 1–100 kΩ. The conventional pixel size of protein bolometers is expected to be 50 microns square with a pitch of 50 microns and the array assembly is required to be packaged in an evacuated vessel. Each pixel is fabricated by depositing single or multi layers of proteins and etching the underlying material to produce a free standing bridge structure (as shown in H. Jerominek, et al,. SPIE Vol. 2746, 60–71).

Figures 2, 3:
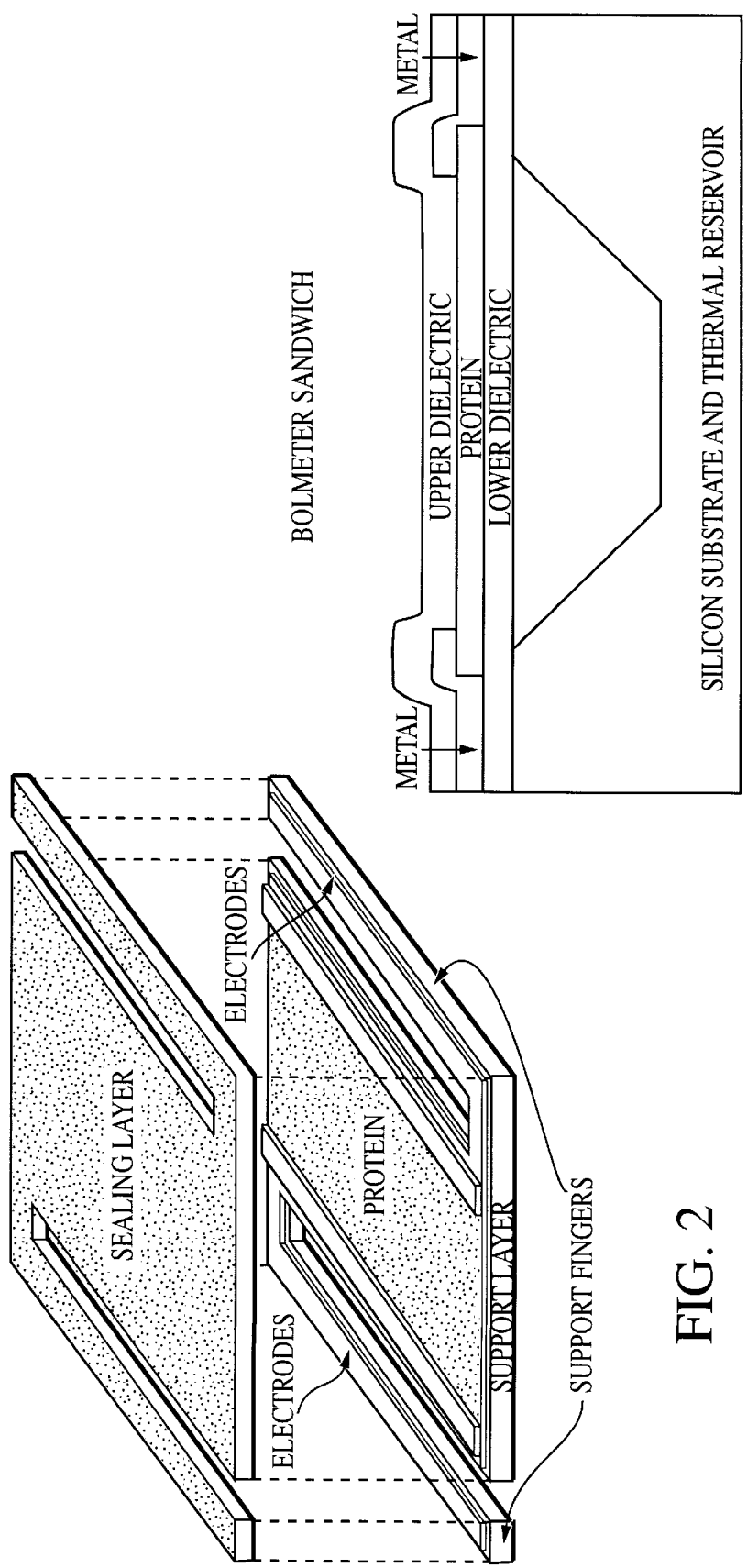
FIG. 2 shows a sealing layer over the protein.
FIG. 3 shows a complete Bolometer construction.

This type of device structure is highly preferable in increasing detector performance because of the expected low thermal conductance of pixels. Proteins are deposited on the top of the oxidized silicons by spin coating techniques (as described in Bolton and J. R. Scherer, J. Phys Chem 1989, 93, 7635–7640). Spin coating technique reported preparation of 1–2 microns thick films of bovine serum albumin (BSA). In order to deposit a thin layer of proteins onto $SiO_2$/Si structure, proteins solutions are simply adsorbed onto the oxidized silicon wafers. The leg metal is then deposited to connect protein pixels to the CMOS electronics. Oxidized silicon is also required to passivate proteins (shown in FIG. 2 as a sealing layer). The X- and Y- metals as shown in FIG. 1 are components of the CMOS circuits.

Names of 14 proteins considered useful are listed below:

Bovine Serum Albumin
Myoglobin
Cytochrome C
Cytochrome c551
Cytochrome b5
Plastocyanin
(2Fe—2S) ferredoxin
Catalase
Trypsin
Hemoglobin
Pepsin
Lysozyme
Ferripin
Alkaline Phosphatase The Biological Microbolometer provides a higher imaging capability compared to vanadium oxide detecting elements because any protein that has a large dipole moment when folded in its native configuration undergoes a substantial change in conductivity when the native protein structure is significantly disrupted with temperature. DNA may even exhibit a sharp break in conductivity when it denatures, since it converts from a double-stranded helix to a random coil.

GC-rich DNAs are expected to give a much sharper break in conductivity than regular DNA because of the more rigid structure of GC rich DNAs in double helix.

I claim:

1. A hybridized biological microbolometer for thermal infrared detection comprising a heat sensitive protein layer with electrical contacts, on a silicon dioxide substrate insulator, said substrate on a silicon base.

2. A microbolometer as in claim 1, wherein said heat sensitive protein is a globular protein selected from the list comprising:

bovine serum albumin, myoglobin, cytochrome C, cytochrome c551, cytochrome b5, plastocyanin, and (2Fe—2S) ferredoxin.

3. A microbolometer as in claim 1, wherein said heat sensitive protein is a globular protein selected from the list comprising:

catalase, trypsin, hemoglobin, pepsin, lysozyme, ferripin, and alkaline phosphatase.

4. A microbolometer as in claim 1, wherein said base comprises associated electronic circuits.

5. A microbolometer as in claim 4, in which said associated circuits comprise CMOS type circuits.

* * * * *